United States Patent [19]

Shimizu et al.

[11] Patent Number: 5,235,212
[45] Date of Patent: Aug. 10, 1993

[54] SEMICONDUCTOR DEVICE HAVING A MECHANICAL BUFFER

[75] Inventors: Yoshio Shimizu; Shoji Kotani; Masatugi Kawaguchi, all of Kitakyushu, Japan

[73] Assignee: Kabushiki Kaisha Toshiba, Kawasaki, Japan

[21] Appl. No.: 322,488

[22] Filed: Mar. 13, 1989

[30] Foreign Application Priority Data

Mar. 18, 1988 [JP] Japan .................................. 63-63201

[51] Int. Cl.$^5$ ..................... H01L 23/48; H01L 29/34
[52] U.S. Cl. .................................... 257/780; 257/781; 257/784; 257/786
[58] Field of Search ................... 357/68, 71; 257/780, 257/781, 784, 786

[56] References Cited

U.S. PATENT DOCUMENTS

| 4,067,099 | 1/1978 | Ito et al. ........................ 28/571 |
| 4,556,897 | 12/1985 | Yorikane et al. ................ 357/71 |
| 4,613,888 | 9/1986 | Mase et al. ..................... 357/71 |
| 4,622,576 | 11/1986 | Bynoski .......................... 357/52 |
| 4,733,289 | 3/1988 | Tsurumaru ...................... 357/73 |
| 4,800,176 | 1/1989 | Kakumu et al. ................. 357/71 |
| 4,841,354 | 6/1989 | Inaba ............................. 357/52 |
| 4,845,543 | 7/1989 | Okikawa et al. ................ 357/70 |
| 4,897,709 | 1/1990 | Yokoyama et al. .............. 357/68 |

FOREIGN PATENT DOCUMENTS

| 54-128280 | 10/1979 | Japan . |
| 57-155740 | 3/1981 | Japan . |
| 0106138 | 7/1982 | Japan .................................. 437/211 |
| 57-145343 | 9/1982 | Japan .................................. 357/68 |
| 003978 | 1/1984 | Japan . |
| 59-3978 | 1/1984 | Japan . |
| 124765 | 7/1984 | Japan . |
| 59-188153 | 10/1984 | Japan . |
| 0188153 | 10/1984 | Japan .................................. 357/71 |
| 0045049 | 3/1985 | Japan .................................. 437/211 |
| 60-234352 | 11/1985 | Japan . |
| 0234352 | 11/1985 | Japan .................................. 357/71 |
| 0019159 | 1/1986 | Japan .................................. 357/71 |
| 62-32636 | 2/1987 | Japan .................................. 357/74 |
| 63-62240 | 3/1988 | Japan . |

OTHER PUBLICATIONS

Benjamin, "high current internal contact structure for integrated circuits", IBM TDB, vol. 19, No. 10, Mar. 1977, p. 3732.
English Translation of Published Unexamined Japanese Patent Application (PUJPA) No. 60-45048 for Inoue.
English Translation of Published Unexamined Japanese Patent Application (PUJPA) No. 62-32636 for Kondo.
English Translation of Japanese Patent Document No. 57-45343 to M. Takagi.

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

A metal having a Knoop hardness of 40 or more is used as an electrode, Cu or a Cu alloy is used as a thin metal wire, and a mechanical buffer layer is formed between the electrode and an insulating material layer. Silicon nitride or metal vanadium is used as the mechanical buffer layer. The thin metal wire is fixed to the electrode metal by compression bonding.

3 Claims, 2 Drawing Sheets

SEMICONDUCTOR DEVICE HAVING A MECHANICAL BUFFER

BACKGROUND OF THE INVENTION

1. Field of the Invention

The present invention relates to a semiconductor device in which a thin metal wire made of copper or a copper alloy is formed at an electrical connection portion.

2. Description of the Related Art

Manufacturing steps of a semiconductor device are roughly classified into a pre-processing step of forming functional elements such as circuits or devices on a semiconductor substrate and an assembly step of assembling the semiconductor substrate on a lead frame.

In this assembly step, a method of utilizing a lead frame is mainly used regardless of whether an IC or an individual semiconductor element is to be manufactured.

In the manufacture of a semiconductor element in which a packing density is significantly increased as a massproduction technique progresses, various steps are automatically performed to eliminate a manual operation which easily produces waste materials. In addition, a multifunctional machine obtained by combining manufacturing apparatuses required in a plurality of steps is used in an assembly step and the like.

This assembly step includes a variety of steps. Of these steps, bonding, i.e., a thermocompression bonding technique concerned with the present invention and a resin encapsulating technique performed subsequently to the bonding will be briefly described below with reference to FIG. 1.

Although a variety of types of lead frames are used, in the case of a multipin type lead frame such as an IC or the like, a plurality of substantially rectangular hollow metal frame members 60 are continuously formed, and a plurality of lead terminals 61 are formed such that each lead terminal is formed in a centripetal direction from each frame member as a unit member, as shown in FIG. 2A. As shown in FIG. 1, a large-diameter bed portion 50 is formed at one end of each lead terminal (not shown), and a semiconductor substrate 51 on which a semiconductor element is formed by a conventional method is mounted by a known mounter.

In the semiconductor element formed on the semiconductor substrate 51, a thin metal wire 53 is formed between an electrode 52 formed adjacent to an impurity region constituting a functional element and the other lead terminal to obtain an electrical connection. For this purpose, a so-called bonding method, i.e., a thermocompression bonding method is utilized.

As the thermocompression bonding method, an ultrasonic thermocompression bonding method is usually applied, and a thin gold wire is generally used. From an economic viewpoint, however, a thin aluminum wire is also adopted in accordance with the type of device. In addition, a thin wire made of copper or a copper alloy has been developed on the basis of the fact that it has a bondability with aluminum, an aluminum alloy, copper or a copper alloy as a material of an electrode formed on a semiconductor substrate.

In the field of semiconductor elements in which cost competition is severe, products which are inexpensive and yet have excellent characteristics are desired. For this reason, a demand has arisen for the use of copper or a copper alloy in place of an expensive thin gold wire.

As described above, in the assembly step utilizing the lead frame, a thin metal wire 53 having a loop with a predetermined height is formed by the thermocompression bonding method utilizing an ultrasonic wave in consideration of a flow of a melted resin in the resin encapsulating step to be performed subsequently to the assembly step.

Examples of an electrode material to be subjected to the above thermocompression bonding step are pure Al, Al-Si, Al-Cu/Al-Si-Cu, and Al-Si-Cu. A hardness of the material, however, is not standardized although it changes in accordance with the type of metal and its formation conditions.

One method of forming the thin metal wire 53 having a loop by the ultrasonic thermocompression bonding is so-called on-element bonding. In this method, a thin metal wire is ultrasonically thermocompression-bonded to an electrode formed adjacent to an impurity region formed to constitute a so-called functional element. This method, however, is not often used because a distortion or cracks are produced in the electrode very frequently.

In a method which is generally used, as shown in FIG. 1, an opening is formed in an insulating material layer 54 coated on the surface of the semiconductor substrate 51, a wiring layer 55 connected to an electrode 52 formed in the opening is formed to extend to the surface of the insulating material layer near the end portion of the semiconductor substrate to serve as a terminal end, and a so-called bonding pad is formed thereat. In this method, therefore, the insulating material layer 54 must function as a buffer layer upon thermocompression bonding. In addition, this thermocompression bonding is so-called first bonding different from stitch bonding.

As described above, as a thin metal wire used in the thermocompression bonding method utilizing an ultrasonic wave, a material which mainly consists of copper or a copper alloy and has been used on an experimental basis is being put to practical use. A thin wire made of copper or a copper alloy, however, has a higher hardness than a thin gold wire. Therefore, a load and an ultrasonic output applied to flatten a ball 57 so as to form flattened-ball shape 571, as shown in FIGS. 3 and 4 for obtaining a proper bonding strength must be increased upon thermocompression bonding of such a thin wire.

For this reason, this load is applied on the insulating material layer formed adjacent to the electrode to which the thin metal wire is to be thermocompression-bonded and produces a distortion or microcracks very frequently, thereby degrading the reliability of a semiconductor element or device.

In order to solve the above problem, methods of
 (a) increasing the thickness of the metal electrode,
 (b) increasing the hardness of the metal electrode and
 (c) increasing the purity of the thin metal wire have been proposed.

None of the above methods is perfect, however, and therefore the thin metal wire must be thermocompression-bonded under the conditions (a load, an ultrasonic output and the like) narrower than those for ultrasonic thermocompression-bonding a thin gold wire.

SUMMARY OF THE INVENTION

It is an object of the present invention to provide a semiconductor device having a connection portion consisting of a novel thin metal wire made of copper or a copper alloy which prevents distortion or microcracks produced when a load is applied on an insulating material layer formed adjacent to an electrode of a semiconductor, and to release limitations upon compression bonding and prevent degradation in characteristics of a semiconductor element, thereby improving its reliability.

In order to achieve the above object, the present invention adopts a method of forming a buffer layer adjacent to an electrode formed on a semiconductor substrate and consisting of a metal having a Knoop hardness of 40 or more, and thermocompression-bonding and fixing a thin metal wire consisting of copper or a copper alloy to the electrode metal.

The present invention is based on the fact that transmission of a stress produced upon compression bonding to the insulating material layer can be reduced and a rate of occurrence of damages to the insulating material layer due to a hardness of a metal constituting the electrode changes by the buffer layer formed between the insulating material layer and the electrode formed on the semiconductor substrate surface.

That is, when a hard and dense buffer layer is formed adjacent to the metal electrode, damages are not caused very often. If a compression bonding condition range is expanded, however, damages are caused in the buffer and insulating material layers from a predetermined condition range. The present invention is completed on the basis of a finding that no damage is caused even under very severe compression bonding conditions as shown in Table 1 if the Knoop hardness of the metal electrode is set to be 40 or more.

(1) Examples of the material of the buffer layer are silicon nitride or metal vanadium which are harder than a thin metal wire consisting of copper or a copper alloy and do not have an adverse influence as a semiconductor element.

(2) The buffer layer may be formed continuously to the electrode formed adjacent to the impurity region or may be formed adjacent to the insulating material layer formed between the impurity region and the electrode and consisting of another material. This is because even if cracks are produced in the insulating material layer formed continuously to the electrode, the buffer layer serves as a protection layer.

Table 1 shows a relationship among bonding conditions, an electrode hardness, a buffer layer material and a damage rate.

As is apparent from Table 1, since only an increase in electrode metal hardness is effective in decreasing the damage rate, a combination of this and the buffer layer is more effective. An alloy or the like may be used to increase the electrode metal hardness.

The Knoop hardness of the electrode metal is set to be 40 or more because if the value is smaller than that, microcracks are produced in the insulating material layer even when the buffer layer is formed.

TABLE 1

| Knoop Hardness of Electrode Metal | Material of Layer Adjacent to Electrode Metal | Load of Capillary | Ultrasonic Output Min. to Max. | | | | |
|---|---|---|---|---|---|---|---|
| | | | A | B | C | D | E |
| about 30 to 42 HK | PAsSG etc. | small | 8.3% | 25.0% | 50.0% | — | — |
| about 30 to 42 HK | PAsSG etc. | medium | 0 | 0 | 18.8% | 37.5% | — |
| about 30 to 42 HK | PAsSG etc. | large | 0 | 0 | 0 | 0 | — |
| about 38 to 68 HK | PAsSG etc. | small | 0 | 0 | 14.6% | 25.0% | — |
| about 38 to 68 HK | PAsSG etc. | medium | 0 | 0 | 0 | 0 | 2.1% |
| about 38 to 68 HK | PAsSG etc. | large | 0 | 0 | 0 | 0 | 0 |
| about 38 to 68 HK | SiN | small | 0 | 0 | 0 | 0 | 0 |
| about 38 to 68 HK | SiN | medium | 0 | 0 | 0 | 0 | 0 |
| about 38 to 68 HK | SiN | large | 0 | 0 | 0 | 0 | 0 |

Note:
P = phosphors
AS = arsenic
SG = silicate glass

As described above, according to the present invention, a thin metal wire consisting of copper or a copper alloy is used in place of a thin gold wire in compression bonding, thereby reducing a cost. In addition, the Knoop hardness of an electrode to which this thin soft metal wire is to be compression-bonded is maintained at a predetermined value, and a dense and hard buffer layer is formed at a position opposite to the electrode, thereby preventing microcracks produced in an insulating material layer covering the surface of a semiconductor substrate. As a result, a reliability of a completed semiconductor device can be improved. More specifically, by the hard electrode and the buffer layer formed at the position opposite to the electrode, the compression bonding condition range can be expanded wider than the conventional condition range, thereby significantly reducing a frequency of producing microcracks in the insulating material layer or the like.

In the present invention, the hardness of the electrode, i.e., the bonding pad formed adjacent and continuously to the impurity region is maintained at the above predetermined value. Therefore, a secondary effect of preventing a projection 58 of the metal formed under pressure upon compression bonding as shown in FIG. 4 can be achieved.

Detailed Description of the Preferred Embodiments

Figure 1:
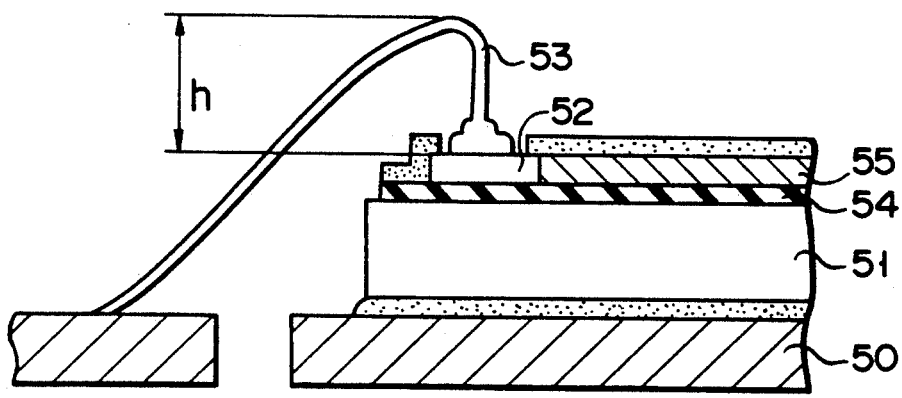
FIG. 1 is a sectional view showing a main part of a conventional semiconductor element.

An embodiment of a semiconductor element according to the present invention will be described below with reference to FIG. 5 in which the same parts as in the conventional technique are denoted by different reference numerals.

Figure 5:
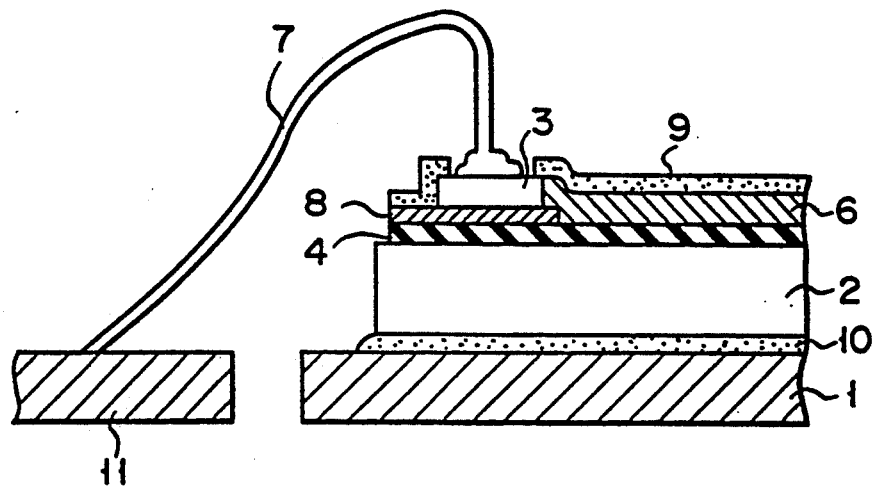
FIG. 5 is a sectional view schematically showing a first embodiment of the present invention.

Referring to FIG. 5, reference numeral 1 denotes a bed portion; 2, a semiconductor substrate; 3, an electrode; 4, an insulating material layer; 6, a wiring layer; 7, a thin metal wire; 8, a buffer layer; 9, a passivation layer; 10, a mount paste; and 11, an inner lead of a lead frame.

Figure 2A:
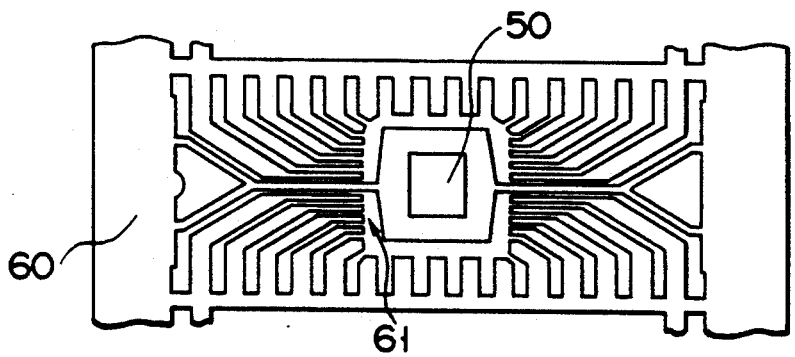
FIGS. 2A and 2B are views showing a structure of a conventional lead frame.
Figure 2B:
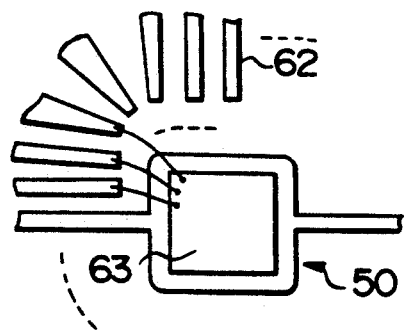
Figure 3:
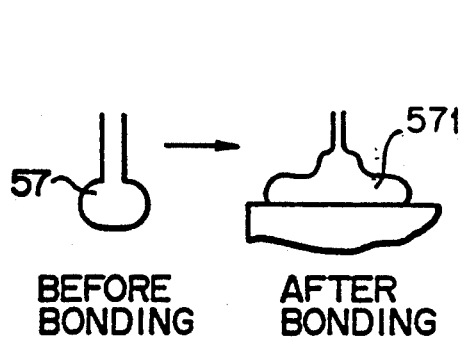
FIG. 3 is a view for explaining that a ball is flattened upon bonding.
Figure 4:
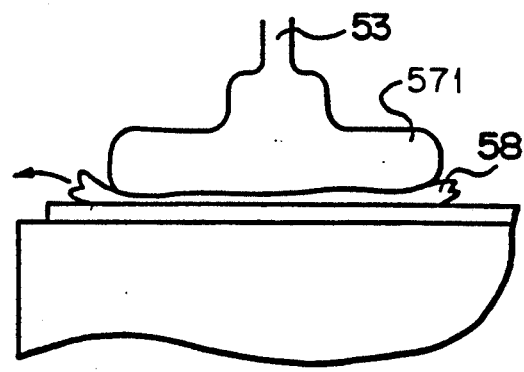
FIG. 4 is a view for explaining that an electrode is flattened to project upon bonding.

As a multipin lead frame for an IC element, a so-called DIP (Dual In-line Package) type or mixed type lead frame is used. That is, as shown in FIG. 2, a plurality of substantially rectangular hollow metal frame members are continuously arranged to form a lead frame, and a lead terminal is formed in a centripetal direction from each metal frame member as a unit member. After the semiconductor substrate 2 is mounted on the large-diameter bed portion 1 located at one of the lead terminals by a conventional method, ultrasonic compression bonding is performed by a ball bonding technique for the electrode 3 formed on the substrate 2.

The substrate 2 consists of silicon, and the insulating material layer 4 is coated on its surface by a known oxidation method. Although not shown, it is a matter of course that an impurity is doped in a predetermined position of the substrate 2 to form a prospective p-n junction formation region so that the element can serve as a functional element.

The electrode 3 consisting of one of Al, Al-Si, Al-Cu/Al-Si-Cu and Al-Si-Cu is formed adjacent to the impurity region by a conventional method, and the wiring layer 6 consisting of the same material extends to the surface of the insulating material layer 4 stacked on the end portion of the substrate 1.

A so-called bonding pad is formed at an end portion of the wiring layer 6 have to have a thickness of about 1 to 2.5 μm. If a plurality of bonding pads are to be formed, a minimum interval between the pads is maintained to be about 80 μm, and a thin metal wire 7 consisting of copper or a copper alloy is connected therebetween by compression bonding. In the present invention, however, the compression bonding is performed for the electrode 3 for simplicity.

The buffer layer 8 is formed between the bonding pad, i.e., electrode 3 and the insulating material layer 4. The layer 8 consists of silicon nitride or metal vanadium having a higher hardness than that of the wire 7 consisting of copper or a copper alloy.

The silicon nitride layer may consist of only $Si_3N_4$ having an accurate stoichiometric ratio, SiN in which a stoichiometric ratio is more less offset or SiON as an oxysalt.

Figure 6:
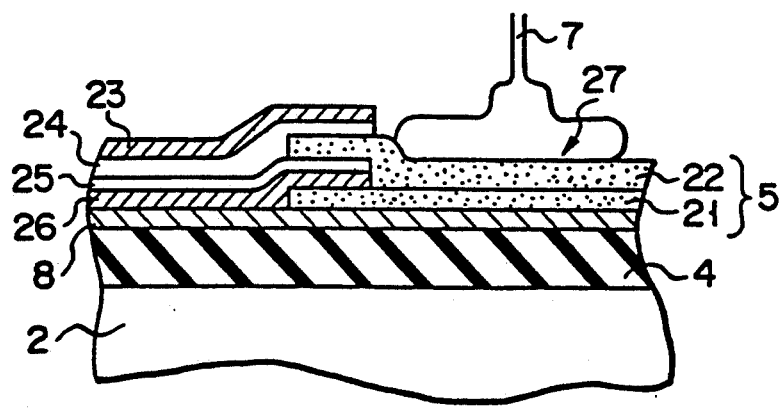
FIG. 6 is a sectional view schematically showing a second embodiment of the present invention.

In the above embodiment, the buffer layer 8 is formed adjacent and continuously to the electrode 3. As shown in FIG. 6, however, the buffer layer 8 may be formed by forming a silicon nitride or metal vanadium layer on the insulating material layer 4, and another material layer may be stacked thereon to form an electrode 5. In this embodiment, the silicon nitride layer is utilized as an insulating interlayer of a multilayered wiring.

Referring to FIG. 6, reference numeral 2 denotes a semiconductor substrate; 4, an insulating oxide film; 5, an electrode; 7, a thin metal wire; 8, a buffer layer; 21, a first Al layer; 22, a second Al layer; 23, an SiN layer; 24, a CVD layer; 25, a polycide layer; and 26, an SiN layer.

A material used as the electrode 3 is Al or an Al alloy as described above. In order to deposit the electrode 3 at a predetermined position by a sputtering method or a vacuum vapor deposition method as described above, a decomposition substrate temperature is increased or a Knoop hardness is set to be 40 or more, by utilizing the alloy.

The ultrasonic thermocompression bonding step for electrically connecting the electrode 3 and the thin metal wire 7 adopts the ball bonding method which utilizes an ultrasonic wave in an inert atmosphere or adopts a method of forming a ball by an electric torch if the thin metal wire 7 consists of copper or a copper alloy.

A final passivation layer 9 is formed on the top of the semiconductor element subjected to the above compression bonding method, and then a resin encapsulating step is performed by a transfer molding method, thereby completing a semiconductor device.

What is claimed is:

1. A semiconductor device comprising:
   a foundation portion;
   a semiconductor substrate formed on said foundation portion;
   an insulating material layer formed on said semiconductor substrate;
   a wiring layer formed on said insulating material layer;
   a passivation layer formed on said wiring layer;
   an opening portion formed in said wiring and passivation layers;
   a mechanical buffer layer, for preventing cracks in said insulating material layer at times when a load is applied to the insulating material layer, formed on said insulating material layer in the opening portion of said wiring and passivation layers, wherein one of silicon nitride and metal vanadium is used as said mechanical buffer layer;
   an electrode formed on said mechanical buffer layer in said opening portion, said electrode having a Knoop hardness of at least 40; and
   a thin metal wire composed of copper;
   wherein one end of said thin metal wire is connected to said electrode by compression bonding and the other end of said thin metal wire is connected to an inner lead of a lead frame.

2. A semiconductor device comprising:
   a foundation portion;
   a semiconductor substrate formed on said foundation portion;
   an insulating material layer formed on said semiconductor substrate;
   a wiring layer formed on said insulating material layer;
   a passivation layer formed on said wiring layer;
   an opening portion formed in said wiring and passivation layers;
   a mechanical buffer layer, for preventing cracks in said insulating material layer at times when a loan is applied to the insulating material layer, made of silicon nitride and formed on said insulating material layer in the opening portion of said wiring and passivation layers;
   an electrode formed on said mechanical buffer layer in said opening portion, said electrode having a Knoop hardness of at least 40 ; and a thin metal wire composed of copper or a copper alloy;

wherein one end of said thin metal wire is bonded to said electrode by compression bonding and the other end of said thin metal wire is connected to an inner lead of a lead frame.

3. A device according to claim 1, wherein said mechanical buffer layer is made of metal vanadium.

* * * * *

UNITED STATES PATENT AND TRADEMARK OFFICE
CERTIFICATE OF CORRECTION

PATENT NO. : 5,235,212
DATED : August 10, 1993
INVENTOR(S) : Yoshio SHIMIZU et al.

It is certified that error appears in the above-indentified patent and that said Letters Patent is hereby corrected as shown below:

Claim 2, column 6, line 61, change "loan" to --load--.

Signed and Sealed this

Nineteenth Day of July, 1994

*Attest:*

BRUCE LEHMAN

*Attesting Officer*     *Commissioner of Patents and Trademarks*